United States Patent [19]

Meyer

[11] Patent Number: 5,659,585
[45] Date of Patent: Aug. 19, 1997

[54] DIGITAL INTEGRATOR AND DIGITAL FILTER OF THE FIRST ORDER

[75] Inventor: Jacques Meyer, Corenc, France

[73] Assignee: SGS-Thomson Microelectronics S.A., Saint Genis, France

[21] Appl. No.: 306,115

[22] Filed: Sep. 14, 1994

[30] Foreign Application Priority Data

Sep. 16, 1993 [FR] France ................... 93 11290

[51] Int. Cl.[6] ................... H03D 3/24; H04B 1/10
[52] U.S. Cl. ................... 375/350; 375/376; 327/147; 364/715.11; 364/724.011
[58] Field of Search ................... 375/327, 343, 375/350, 376; 364/715.11, 724.01, 724.11; 370/72, 123; 327/147, 156

[56] References Cited

U.S. PATENT DOCUMENTS

| | | | |
|---|---|---|---|
| 3,757,261 | 9/1973 | Sather | 235/152 |
| 5,056,054 | 10/1991 | Wong et al. | 375/376 |
| 5,272,730 | 12/1993 | Clark | 375/376 |
| 5,351,275 | 9/1994 | Wong et al. | 375/376 |

FOREIGN PATENT DOCUMENTS 9313591   7/1993   WIPO ................... 375/376

*Primary Examiner*—Young T. Tse
*Attorney, Agent, or Firm*—Wolf, Greenfield & Sacks, P.C.; James H. Morris

[57] ABSTRACT

A filter uses a digital integrator that establishes the sum, weighted by a coefficient B, of q1-bit input data arriving at a frequency F. The integrator includes a first p-bit shift-right register; a second q-bit shift-right register, circularly connected and storing the current input data in its most significant bits; and a full bit adder having two inputs respectively connected to the outputs of the first and second shift registers, and an output connected to the input of the first shift register. A sequencer enables the shifting of the first register during p clock cycles, and the shifting of the second register during q clock cycles starting b cycles after the beginning of the p cycles, number b being selected as a function of coefficient B.

17 Claims, 4 Drawing Sheets

DIGITAL INTEGRATOR AND DIGITAL FILTER OF THE FIRST ORDER

BACKGROUND OF THE INVENTION

1. Field of the Invention

The present invention relates to phase-locked loops (PLLs) and, more particularly, to digital filters used in digital PLLs.

2. Discussion of the Related Art

FIG. 1 schematically represents a conventional PLL structure. The PLL includes a voltage-controlled oscillator (VCO) 10 providing a frequency NF to a divide-by-N counter 12. A phase comparator 14 receives the output frequency F from divider 12 and a reference frequency Fref. The phase comparator 14 provides a phase error signal e to a filter 16 whose output c controls the VCO 10. In steady state, the phase and frequency of signal F are locked on signal Fref. In common applications, for example in the horizontal scanning of a television set, the frequency F to be obtained is approximately 15 kHz, the frequency NF is approximately 12 MHz (N=768), and filter 16 is a low-pass filter whose cut-off frequency is a few hundred Hz.

The present trend is to realize all the PLL elements in the form of digital circuits. This avoids the use of high value capacitors that are difficult to integrate, renders the elements programmable, and simplifies the design operations by allowing the use of standard blocks in MOS or CMOS technologies.

FIG. 2 represents a conventional digital low pass filter of the first order, with an integral and proportional correction function, that could be substituted for filter 16. The digital low-pass filter includes a register 20 that is fed back through an adder 21. The register 20 is clocked by the above signal F so that the output of adder 21 is loaded in the register at each period of signal F. A digital error signal E is provided to a second input of adder 21 through a multiplier 23 by a constant B, and to an adder 25 through a multiplier 27 by a constant A. The adder 25 also receives the output of adder 21 and provides a digital correction signal C intended to control a frequency synthesizer that replaces the VCO 10.

With this configuration, at a period k of signal F, value C is expressed by:

$$C(k)=I(k+1)+A\ E(k), \text{with}$$

$$I(k+1)=I(k)+B\ E(k),$$

where I(k) is the content of register 20 at period k of signal F. This corresponds to low-pass filtering of the first order.

To obtain a suitable operation of the PLL in the field of TV horizontal scanning, the register 20 must be large, for example of 22 bits, whereas it is sufficient that the phase error E is of 9 bits, and the correction signal C of 14 bits (signal C is then obtained from the 14 most significant bits of value I). The adders 21 and 25 must be 22-bit adders, each including 22 bit-to-bit or elemental adders, which involves a large silicon area.

Coefficients A and B are, for example, 7-bit numbers. Then, multipliers 23 and 27 provide a 16-bit result. These 16 bits do not necessarily correspond to the 16 most significant bits of register 20, which allows to introduce between the multipliers and the adders a constant dividing ratio by a power of 2 (the coefficients A and B are generally lower than 1, approximately 1/10 and 1/1000, respectively, for the horizontal scanning in a television set).

The 16-bit multipliers 23 and 27 also occupy a large area. If coefficients A and B are powers of two, multipliers 23 and 27 can be replaced by shift-left or shift-right circuits, whose shifting is determined by coefficients A and B. Such shift circuits occupy a smaller but still significant silicon area.

SUMMARY OF THE INVENTION

An object of the present invention is to provide a digital filter, adapted to a system that supplies data to be filtered at a relatively low frequency, and that occupies a particularly small silicon area.

This object is achieved with a digital integrating filter that establishes the sum, weighted by a coefficient B, of q1-bit input data arriving at a frequency F. The digital integrating filter includes a first p-bit shift-right register; a clock of a frequency at least p times higher than frequency F; a second q-bit shift-right register ($q1 \leq q \leq p$), circularly connected and storing the current input data in its most significant bits; and a full bit adder having two inputs respectively connected to the outputs of the first and second shift registers, an output connected to the input of the first shift register, a carry output, and a carry input receiving the carry output delayed by one clock cycle. A sequencer enables the shifting of the first register during p clock cycles, and the shifting of the second register during q clock cycles, starting b cycles after the beginning of the p cycles, b being selected as a function of coefficient B.

According to an embodiment of the invention, the integrator includes a multiplexer controlled by the sequencer to provide the adder with the output bits of the second shift register during the q1 first cycles of these q cycles, and the sign bit of the current input data after the q1 cycles until, at least, the end of these p cycles.

According to an embodiment of the invention, number b is chosen such that $B=2^{b-p+q1}$.

The present invention relates more particularly to a digital low-pass filter of the first order including an integrator such as the one mentioned above, in which the clock frequency is at least 2p times higher than the frequency F. The low-pass filter includes a routing mechanism controlled by the sequencer for connecting the first shift register circularly and for connecting the input of the second shift register to the adder output after the p clock cycles. The sequencer is designed to enable the shifting of the first register during p additional cycles, and the shifting of the second register until the end of the p additional cycles after a delay of a cycles from the beginning of the p additional cycles. The content of the second register is provided as a filter out-put after the p additional cycles. Number a is selected as a function of a weighting coefficient A of the input data.

According to an embodiment of the invention, the filter includes a multiplexer controlled by the sequencer to provide the adder with the output bits of the second shift register during the first q1 cycles of the p additional cycles, and the sign bit of the current input data after the first q1 cycles until the end of the p additional cycles.

According to an embodiment of the invention, number a is selected such that $A=2^{2a-2p+q1+q}$.

The foregoing and other objects, features, aspects, and advantages of the invention will become apparent from the following detailed description of the present invention when taken in conjunction with the accompanying drawings.

DETAILED DESCRIPTION

The present invention is described in connection with a digital PLL, but those skilled in the art will appreciate that the invention applies to any system providing data to be filtered at a relatively low frequency.

Figure 1:
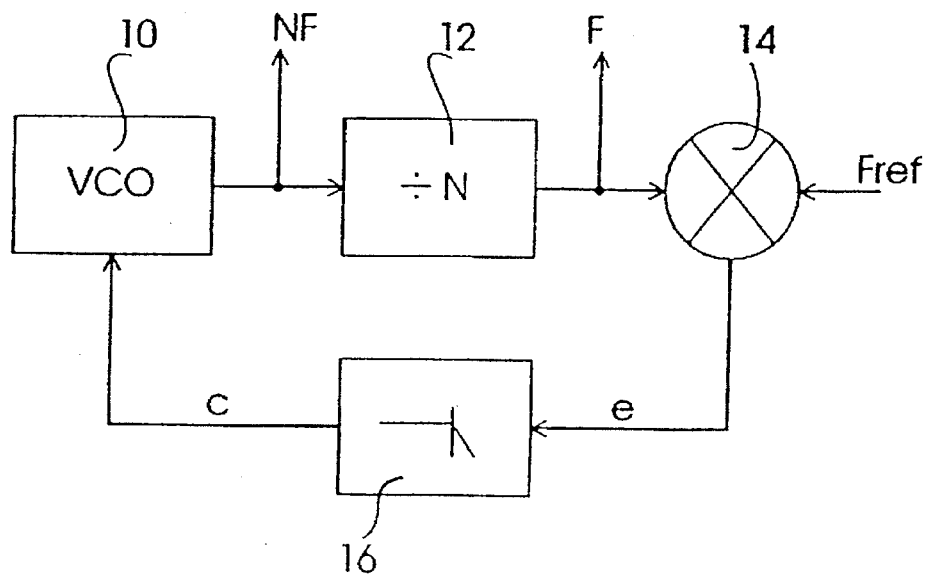
FIG. 1 described above, represents a conventional PLL architecture.

A PLL (FIG. 1) often provides an output frequency F and a much higher frequency NF that is directly provided by the VCO 10. The phase error E provided by the phase comparator (whether analog or digital) changes only once at each period of signal F. That is, the phase error E is sampled at frequency F. Thus, filter 16 remains "inactive" during most of each period of signal F.

The present invention proposes to take advantage of this inactivity time by providing a filter having a specific structure that uses a sequential or serial adder. A sequential adder uses a single bit-to-bit adder that successively sums the bits of data to be summed at the frequency of a fast clock.

Therefore, the frequency of the fast clock must be higher than the product of the frequency of arrival of the data to be summed by the number of bits to be processed by the filter. This condition is readily satisfied in a PLL such as the one of FIG. 1 by using the frequency NF as the fast clock frequency.

Figure 3A:
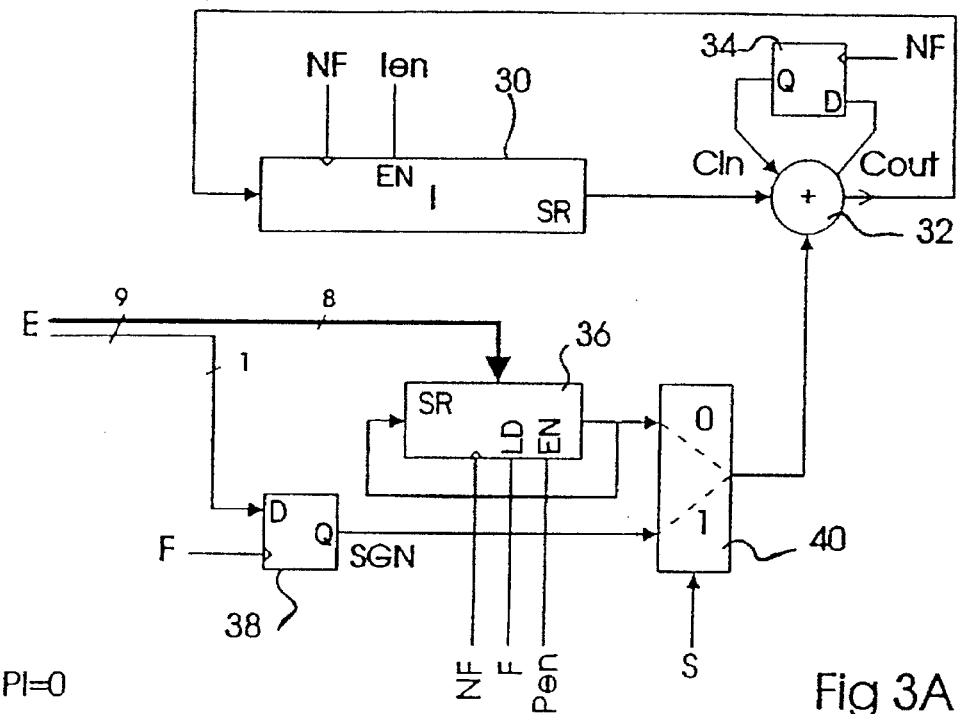
FIG. 3A represents an embodiment of a digital integrating filter according to the invention.

FIG. 3A represents an embodiment of a digital integrating filter according to the invention. This filter includes a shift-right register 30 storing the integral value I of the error signal E to be filtered. Register 30 is clocked by the signal NF provided by the VCO 10, but shifts effectively occur only when an enabling signal fen is active. Then, the output of register 30 provides the successive bits of the integral value I, by order of increasing weights (shift-right), to a bit adder 32 whose output is reinjected at the input of register 30.

The adder 32 is a full adder; it includes a carry output Cout that is provided back to a carry input Cin through a flip-flop 34 clocked by signal NF. Thus, the carry of each elemental sum serves to calculate the next elemental sum.

The phase error E is generally a signed number. That is, its most significant bit indicates a positive or negative sign of this error. A shift-right register 36 receives at a pre-load input all the bits, except the sign bit, of data E. The sign bit is provided to a flip-flop 38. The shift register 36 is circularly connected. That is, its output is connected to its input, so that the bits stored in register 36 are circularly shifted when register 36 is enabled. The shift register 36 is clocked by signal NF and is enabled by a signal Pen. To store the data E at each period of signal F, the enable input of flip-flop 38 and a load enable input of register 36 receive the signal F.

A 2-to-1 multiplexer 40 receives the sign bit SGN stored in flip-flop 38 and receives, by order of increasing weight, the output bits of shift register 36, once it is enabled by signal Pen. The multiplexer 40 receives a selection signal S and provides the selected bit to a second input of the elemental adder 32.

This configuration, as will be described in more detail below, is an integrator whose output value is stored in register 30.

A low-pass filter of the first order according to the invention is connected according to the configuration of FIG. 3A in a first step, which is indicated by a signal PI at 0. In a second step, within the same period of signal F, the filter is connected according to a second configuration, which is indicated by signal PI at 1.

Figure 3B:
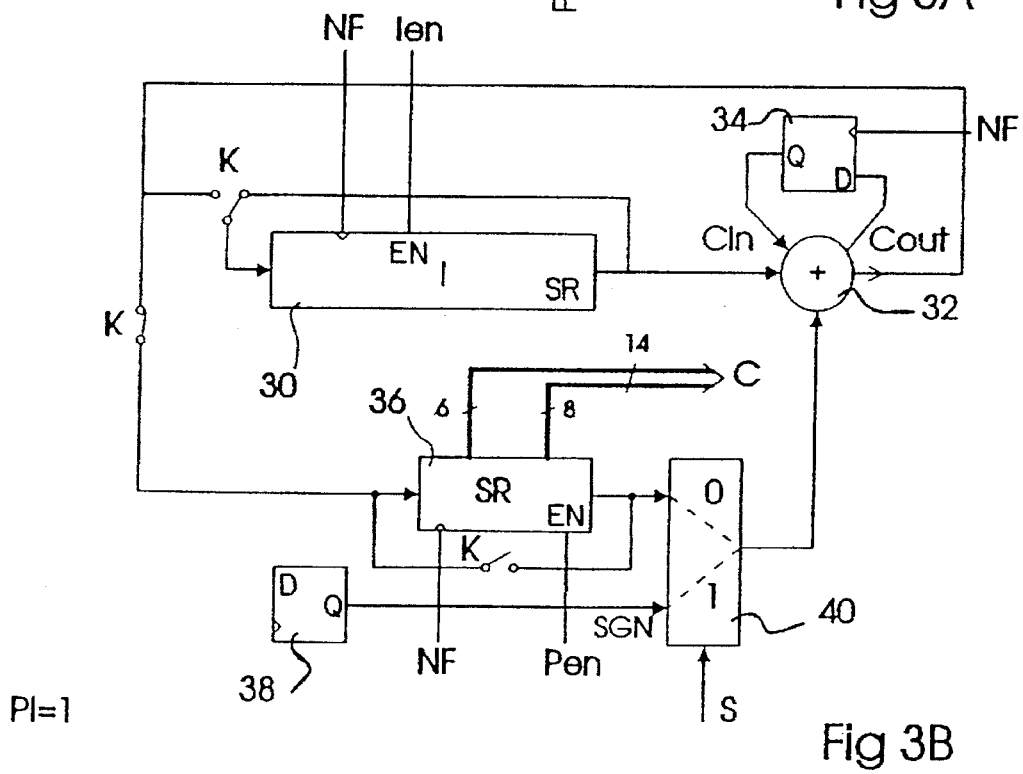
FIG. 3B represents an exemplary configuration of the filter of FIG. 3A allowing to obtain, in two operation steps, a digital low-pass filter of the first order.

FIG. 3B represents an embodiment of this second configuration. This configuration differs from the first configuration in that the register 30 is circularly connected and in that the output of adder 32 is connected to the input of register 36 which is no longer circularly connected. The content of register 36 now corresponds to the output of the filter, that is, to the correction value C. The switching from the configuration of FIG. 3A to the configuration of FIG. 3B is achieved by switches K controlled by the signal PI.

Figure 3C:
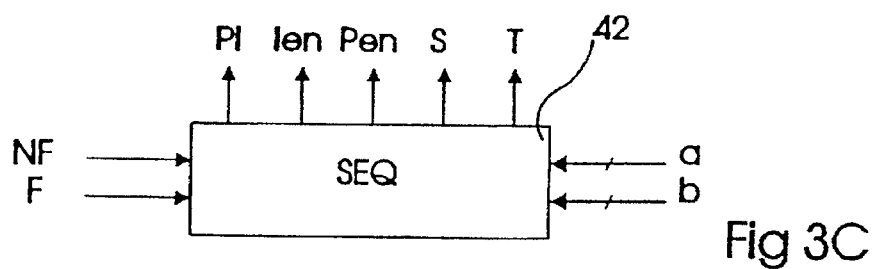
FIG. 3C represents a sequencer for controlling the operation of the circuits of FIGS. 3A and 3B.

Signals PI, Ien, Pen, and S are provided by a sequencer 42 illustrated in FIG. 3C. Sequencer 42 receives signals F and NF and two digital data a and b that correspond to coefficients A and B.

The first configuration is designed to carry out an integral correction of error E according to the relation:

$$I(k+1)=I(k)+B\ E(k).$$

Thus, before adding the current error value E(k) (stored in register 36) to the preceding integral value I(k) (stored in register 30), value E(k) must be multiplied by constant B, which is in practice lower than 1. This multiplication is carried out by adding the content (E(k)) of the shift register 36, shifted to the right by a determined number of bits, to the content (I(k)) of register 30.

The second configuration is designed to carry out a proportional correction of error E according to the relation:

$$C(k)=I(k+1)+A\ E\ (k).$$

To achieve this purpose, the content of register 30 (now I(K+1)) is added to the content (E(k)) of register 36 shifted to the right by a determined number of bits to multiply value E(K) by constant A, in practice lower than 1. Sum C(k) is stored in the shift register 36, overwriting value E(K).

The combined effect of these two configurations is an integral proportional correction, that is, a digital low-pass filter of the first order.

Figure 2:
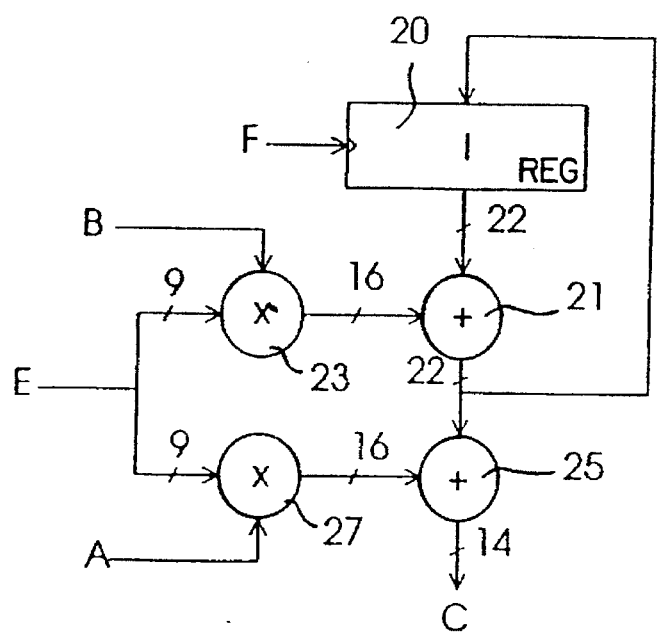
FIG. 2 described above, represents a conventional digital filter of the first order.

The following description is made in relation with the example of FIG. 2, that is, with an integral value I of p=22 bits, an error E of q1=8 bits plus a sign bit SGN, and a correction data C of q=14 bits. Accordingly, the register 30 is a 22-bit register. The register 36 that must store the correction data C is a 14-bit register. Therefore, register 36 includes 6 extra bits in relation to the error E without its sign bit, which is unimportant, as will be seen below.

Figure 4:
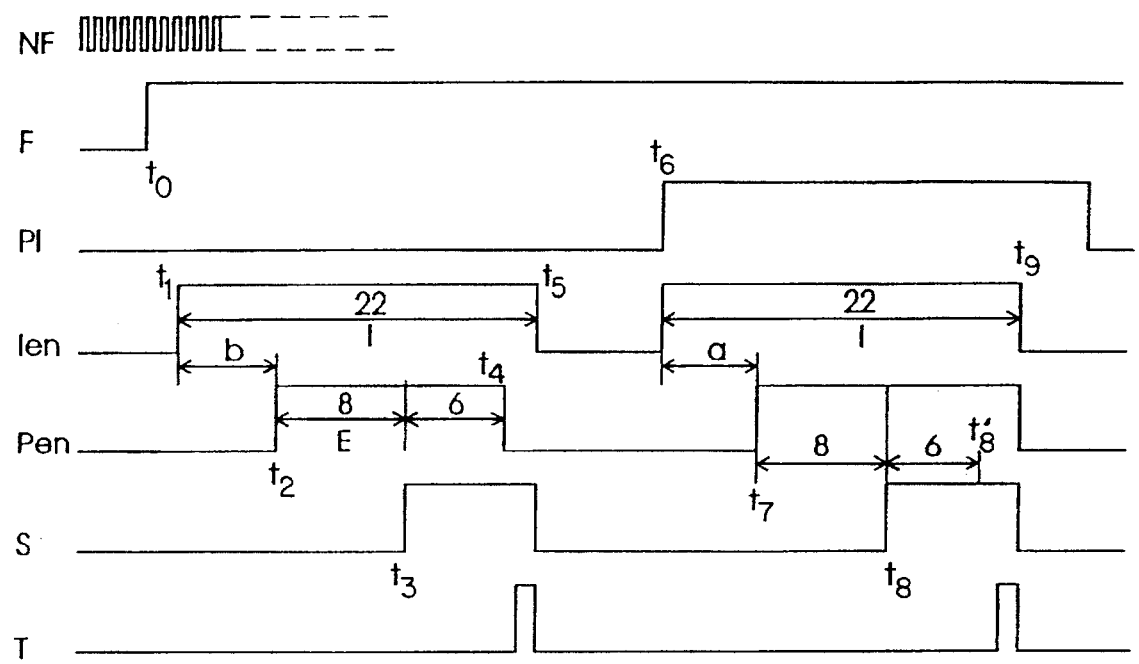
FIG. 4 is a timing diagram of the control signals of the configurations of FIGS. 3A and 3B.

FIG. 4 is a timing diagram of the various signals used in a filter according to the invention: this may be useful for gaining a better understanding of the operation of the filter. The shifts of registers 30 and 36 are clocked by signal NF whose frequency is higher than the sampling frequency F of error E by at least twice the size of register 30. In the example of a TV horizontal scan PLL, the ratio between frequencies NF and F is 768, which is more than enough.

At time $t_0$, a rising edge of signal F occurs. Signals Ien, Pen, S, and PI provided by sequencer 42 are inactive. The 8 least significant bits of error E are loaded in the shift register 36, and the sign bit of error E is loaded in flip-flop 38. As indicated above, register 36 is a 14-bit register. The 8 least significant bits of register 36 receive the 8 least significant bits of error E, and the 6 remaining most significant bits are arbitrary bits. (Since these 6 most significant bits are not pre-loaded, the corresponding stages of the shift register 36 may be of simpler configuration than the others).

At time $t_1$, for example one cycle of signal NF after time $t_0$, the register 30 is enabled by signal Ien for 22 cycles until time $t_5$.

At time $t_2$, b cycles-after time $t_1$, register 36 is enabled by the activation of signal Pen. The signal Pen remains active for 14 cycles until time $t_4$. At each cycle from time $t_2$, the bit that leaves register 30 is added to the bit that leaves the shift register 36 by adder 32, and the sum is reinjected at the input of register 30. The bits of weights b+1 and higher of register 30 are replaced with the sum of these bits and of the bits of weights 0 and higher of error E.

At time $t_3$, 8 cycles after time $t_2$ all the bits of error E are added to the content of register 30. However, the register 36 still continues to be shifted for 6 cycles to recover its initial state. Between times $t_3$ and $t_5$, the multiplexer 40 is activated by signal S in order to add to the bits of weights b+8 and higher of register 30 the sign bit SGN of error E (the 6 additional bits of register 36 are ignored).

At time $t_5$, the shift register 30 has achieved one "turn" and its content has been increased by the error E shifted to the right by 22-b-8 bits, that is, multiplied by $B=2^{b-14}$. Of course, to allow this integrating filter to suitably operate, time $t_3$ when all the bits of error E have been accounted for, must occur before time $t_5$.

At time $t_6$ which is determined by the sequencer, and which can be time $t_5$ or a later time, the signal PI is activated to connect the filter according to the configuration of FIG. 3B. Immediately, the register 30 is again activated by signal Ien during 22 cycles until time $t_9$.

At time $t_7$, a cycles after time t6, register 36 is activated by signal Pen, until time $t_9$. At each cycle from time $t_7$, the bits of weights a and higher of register 30 are added to the bits of weights 0 and higher of register 36, and the sum is reinjected, this time, into register 36.

At time $t_8$, the 8 bits of error E have been processed. However, the register 36 remains enabled so that it stores in its 6 additional bits the sum of the remaining most significant bits of register 30 and the sign bit SGN of error E. To achieve this purpose, between times $t_8$ and $t_9$, the signal S is activated to select the sign bit SGN in multiplexer 40. The initial states of the 6 additional bits of shift register 36 are ignored.

At time $t_8'$, the content of register 36 has been shifted by one turn, but its shifting remains enabled until time $t_9$ because most significant bits are still to be taken into account in register 30 until time $t_9$. Accordingly, at time $t_9$, register 36 stores the value of the 14 most significant bits of register 30 increased by error E. Error E has been shifted to the right by 22-a-8 bits and by the number of cycles between times $t_8'$ and $t_9$, that is, by 22-a-14 bits. The total shift to the right is of 22-2a bits, which corresponds to a multiplication of error E by a coefficient $A=2^{2a-22}$.

At time $t_9$, the register 36 contains the desired filtered value C that is expressed, at a period k of signal F, by:

$$C(k)=I(k+1)+A\,E(k), \text{ with}$$

$$I(k+1)=I(k)+B\,E(k),$$

value I(k+1) being established at time $t_5$.

Of course, to allow the filter to suitably operate, time $t_8'$ must occur before time $t_9$. The signal PI is deactivated at time $t_9$ or later.

It is desirable, in a digital PLL, that the content of register 30 (the integral value I) does not over or under flow (that is, abruptly pass from a maximum value to a zero value, or vice versa). To achieve this purpose, additional devices, described below, are provided.

A signal T is active at each last enable cycle of register 30. Signal T enables a circuit (described below) that prevents the register 30 from overflowing when its content reaches its maximum value and a positive value is added thereto, and from underflowing when its content reaches value zero and a negative value is added thereto.

Figure 5:
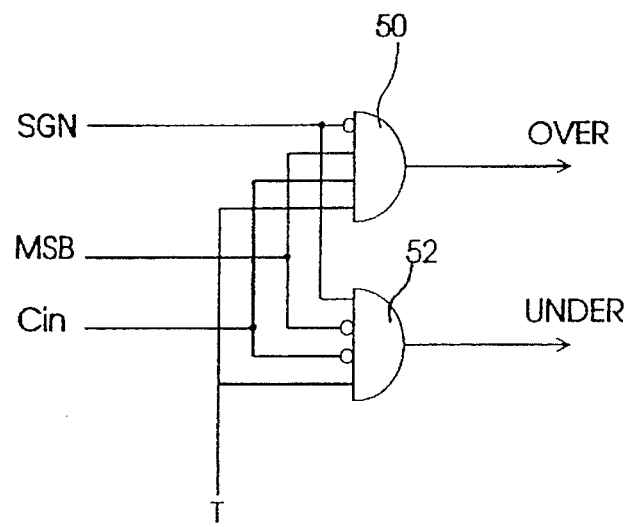
FIG. 5 represents an embodiment of a register overflow detection circuit.

FIG. 5 represents an embodiment of the over/under flow detection circuit using the above signal T. This circuit is enabled by signal T and takes into account the states of the three inputs of adder 32, namely, the carry input Cin, the output of register 30, and the output of multiplexer 40. When the signal T is activated, the output of register 30 provides the most significant bit, MSB, of its content, and multiplexer 40 provides the sign bit SGN.

The circuit includes two four-input AND gates 50 and 52. The AND gate 50 provides a signal OVER for indicating an overflow, and the gate 52 provides a signal UNDER for indicating an underflow. The activation of signal OVER causes the content of register 30 to be reset to the maximum value, and the activation of signal UNDER causes the content of the register to be reset to the minimum value (0).

The gate 50 receives signals MSB, Cin, T, and the complement of signal SGN. The gate 52 receives signals SGN, T, and the complements of signals MSB and Cin. The signal T enables the use of the inputs of adder 32 when they effectively correspond to sign bit SGN and to the most significant bit MSB.

If the sign bit SGN is at 0 (which indicates a positive number) and if the most significant bit MSB and the carry signal Cin are at 1, the register is in the overflow state; signal OVER is activated to re-establish the register at its maximum content (1).

If the sign bit is at 1 (which indicates a negative value) and if the most significant bit MSB and the carry signal Cin are at 0, the register is in the underflow state; signal UNDER is activated to re-establish the register at its minimum content (0).

However, a register that can be set to 1 or to 0 occupies a greater area than a register that does not have this possibility, because each of its flip-flops requires 4 additional transistors.

Figure 6:
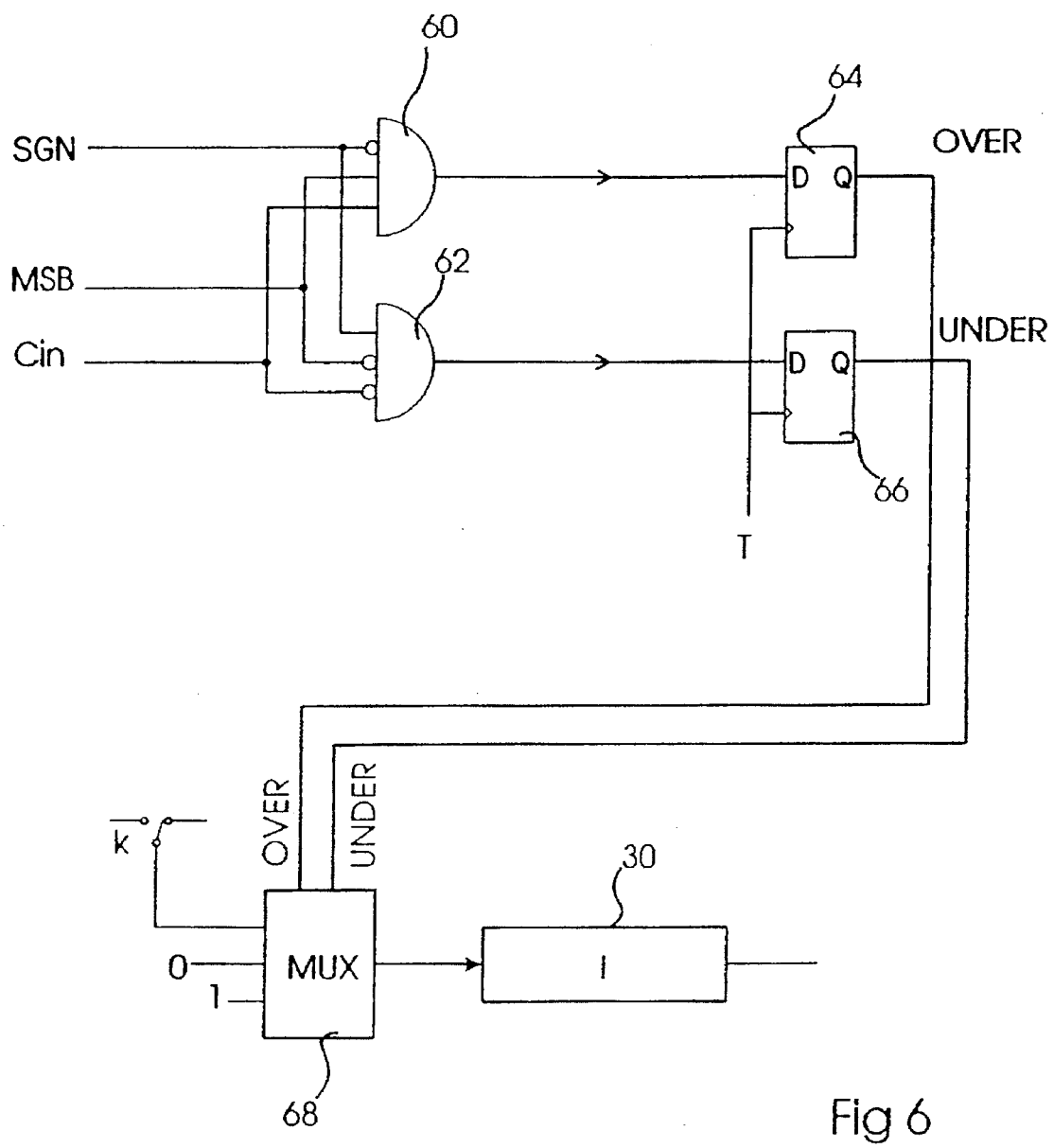
FIG. 6 partially represents an advantageous embodiment of the circuit of FIG. 3B using an overflow detection.

FIG. 6 partially represents an embodiment that simplifies the structure of the circuit of FIG. 3B in the case where register 30 is to be protected against over-flowing. Two AND gates 60 and 62 are respectively connected in the same way as gates 50 and 52 of FIG. 5, except that they do not receive the signal T. The signal T enables two flip-flops 64 and 66 to respectively store the outputs of gates 60 and 62. The outputs of flip-flops 64 and 66 respectively provide the above signals OVER and UNDER.

A multiplexer 68 at the input of register 30 is controlled by signals OVER and UNDER. When signals OVER and UNDER are at 0 (inactive), multiplexer 68 connects the register 30 in its configuration of FIG. 3B. When signal OVER is active, the input of register 30 is connected to state 1. When signal UNDER is active, the input of register 30 is connected to state 0. The sequencer 42 enables the register 30 during 22 additional cycles after time $t_9$ of FIG. 4, so that the register is re-set to 0 or to 1 (depending on the activated signal UNDER or OVER) during the last additional cycles.

With a filter according to the invention, a significant area of silicon is spared. Indeed, instead of two 22-bit adders, a single bit-to-bit adder is used. Furthermore, the need for two multipliers is avoided.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A digital integrating filter that establishes a sum, weighted by a first coefficient, of input data of a first number of plurality of bits that arrive at a frequency F, comprising:

a first shift-right register having a capacity to hold a second number of plurality of bits;

a clock having a frequency at least the second number of times higher than the frequency F;

a second shift-right register having a capacity to hold a third number of plurality of bits, the third number being greater than or equal to the first number of plurality of bits and less than or equal to the second number of plurality of bits, the second shift-right register being circularly connected and storing the most significant bits of the current input data;

a full bit adder having two inputs respectively connected to outputs of the first and second shift-right registers, the adder having a sum output connected to the input of the first shift-right register, a carry output, and a carry input receiving the carry output delayed by one clock cycle; and a sequencer for enabling the shifting of the first shift-right register at the frequency of the clock a number of times corresponding to the second number of plurality of bits, and for enabling the shifting of the second shift-right register at the frequency of the clock a number of times corresponding to the third number of plurality of bits, wherein the second shift-right register starts shifting a predetermined number b of clock cycles after the first shift-right register is enabled b being a function of the first coefficient.

2. The filter of claim 1, including a multiplexer controlled by the sequencer to provide the adder with output bits of the second shift-right register during a number of shifts corresponding to the first number of plurality of bits, and provide a sign bit of the input data after the number of shifts corresponding to the first number of plurality of bits, at least until the first shift-right register shifts a number of times corresponding to the second number of plurality of bits.

3. The filter of claim 1, wherein b is chosen such that the first coefficent equals $2^{b-b+q1}$.

4. A digital integrating filter, comprising:

a first shift register;

a second shift register circularly connected and storing input data;

a full bit adder receiving as inputs serial outputs from both the first shift register and the second shift register, an output of the adder being provided to a serial input of the first shift register, a carry-out output of the adder being delayed one clock cycle and received as a carry-in input of the adder; and a sequencer including means for causing the first shift register to shift for a first plurality of clock cycles and for causing the second shift register to shift for a second plurality of clock cycles, the second shift register starting its shifting after the first shift register begins its shifting operation.

5. A method of integrating digital input data of q1 bits arriving at a frequency F, the method comprising the steps of:

(a) receiving the q1-bit input data into a q-bit shift register that is circularly connected;

(b) causing a p-bit shift register to shift for p cycles, each cycle being at a frequency at least p times higher than F, and p being greater than or equal to q1 and q1 being greater than or equal to q;

(c) a predetermined number of cycles after step (b) begins, causing the q-bit shift register to shift for q cycles, each cycle being at the frequency at least p times higher than F; and (d) during steps (b) and (c) full-bit adding serial outputs of the q-bit shift register and the p-bit shift register, in which a carry-out output is delayed then provided as a carry-in input to the full-bit adding operation and in which an output of the full-bit adding operation is provided as an input to the p-bit shift register.

6. A digital filter comprising:

a first shift register having a capacity to hold a first plurality of bits;

a second shift register having a capacity to hold a second plurality of bits less than or equal to the first plurality of bits, wherein one of the first shift register and the second shift register is circularly connected, and another one of the first shift register and the second shift register is not circularly connected; and an adder which receives serial outputs of the first and second shift registers, the adder having an output connected to an input of the shift register not circularly connected, wherein the adder further includes a carry output, and a carry input receiving the carry output at predetermined intervals.

7. The digital filter of claim 6, wherein the digital filter establishes a sum, weighted by a coefficient B, of input data of 2l bits arriving at a frequency F, and the digital filter is a first order low pass filter wherein the first shift register includes p bits; and a clock of a frequency at least 2p times higher than frequency F;

the second shift register includes q bits, q being greater than or equal to q1 and less than or equal to p, the second shift-register being circularly connected and storing the most significant bits of the current input data;

the adder includes two inputs respectively connected to outputs of the first and second shift registers, the adder having a sum output connected to the input of the first shift register, wherein the carry input receives the carry output delayed by one clock cycle; and the digital filter further includes a sequencer for enabling the shifting of the first register during p clock cycles, and the shifting of the second register during q clock cycles, starting b cycles after the beginning of the p cycles, b bing a function of the coefficient B; the low-pass filter further comprising routing means for connecting the first shift register circularly and an input of the second shift register to the output of the adder, under the control of the sequencer, after said p clock cycles, the sequencer having means for enabling the shifting of the first register for p additional cycles, and means for shifting the second register until the end of the p additional cycles after a delay of a cycles from the beginning of the p additional cycles, the content of the second register being provided as a low-pass filter output after the p additional cycles, wherein number a is a function of a weighting coefficient A of the input data.

8. The filter of claim 7, further including a multiplexer controlled by the sequencer to provide the adder with the output bits of the second shift register during the first q1 cycles of said p additional cycles, and a sign bit of the input data after the first q1 cycles until the end of said p additional cycles.

9. The filter of claim 7, wherein number a is selected such that $A=2^{2a-2p+q1+q}$.

10. The digital filter of claim 6, wherein the first shift register is a p-bit shift register;

the second shift register is a q-bit shift register that receives input data;

the adder is a full adder that serially receives outputs of the p-bit shift register and the q-bit shift register as adder inputs, the adder having means for delaying the carry-out of the adder and for providing the delayed carry-out as the carry-in to the adder; wherein the digital filter is a low pass filter and further includes:

a routing network that, in a first mode, connects an output of the adder to an input of the p-bit shift register and connects an output of q-bit shift register to an input of the q-bit shift register and that, in a second mode, connects the output of the adder to the input of the q-bit shift register and connects the output of the p-bit register to the input of the p-bit shift register; and a sequencer including means for asserting the first mode for p cycle and for causing the p-bit shift register to shift during the first mode and including means for causing the q-bit shift register to begin shifting a first predetermined number of cycles after the p-bit register begins shifting, the sequencer further including means for asserting the second mode for p cycles, after the first mode is completed, including means for causing the q-bit shift register to begin shifting a second predetermined number of cycles after the p-bit register begins shifting.

11. The low-pass filter of claim 10 further comprising a latch for holding a sign bit of the input data and a multiplexer receiving as inputs the latched sign bit and the output of the q-bit shift register, the multiplexer selecting among its inputs under the control of the sequencer such that the q-bit shift register is initially selected as an input for a number of cycles equal to the number of bits of input data and afterwards the sign bit is selected, the output of the multiplexer being provided to the full adder as an adder input.

12. The digital low-pass filter of claim 10 wherein the first predetermined number of cycles corresponds to a first weighing coefficient and wherein the second predetermined number of cycles corresponds to a second weighing coefficient.

13. The digital low-pass filter of claim 10 wherein the input data arrives at a frequency of F and the shift registers operate at least at a frequency of p×F.

14. The filter according to claim 6, further comprising a plurality of switches, wherein the switches have a first connection state in which the filter is an integrating filter, and the second shift register is circularly connected.

15. The filter according to claim 14, wherein in the first connection state the output of the adder is connected to an input of the first shift register.

16. The filter according to claim 14, wherein the plurality of switches has a second connection state in which the filter is a low pass filter, and the first shift register is circularly connected.

17. The filter according to claim 16, wherein in the second connection state the output of the adder is connected to an input of the second shift register.

* * * * *

UNITED STATES PATENT AND TRADEMARK OFFICE
CERTIFICATE OF CORRECTION

PATENT NO. : 5,659,585
DATED       : August 19, 1997
INVENTOR(S): Jacques Meyer

It is certified that error appears in the above-identified patent and that said Letters Patent is hereby corrected as shown below:

In claim 3, line 2, the equation currently reads "$2^{b-b+q1}$" it should read --$2^{b-p+q1}$--.
In claim 7, line 3, "of 21bits" should read --of ql bits--; and
In claim 7, line 61, "bing" should read --being--.

Signed and Sealed this

Twenty-first Day of October 1997

Attest:

BRUCE LEHMAN

Attesting Officer

Commissioner of Patents and Trademarks